(12) United States Patent
Hasegawa et al.

(10) Patent No.: US 11,251,161 B2
(45) Date of Patent: Feb. 15, 2022

(54) 2-IN-1 TYPE CHOPPER MODULE

(71) Applicant: Mitsubishi Electric Corporation, Tokyo (JP)

(72) Inventors: Shigeru Hasegawa, Tokyo (JP); Tetsu Negishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/630,822

(22) PCT Filed: Sep. 28, 2017

(86) PCT No.: PCT/JP2017/035096
§ 371 (c)(1),
(2) Date: Jan. 13, 2020

(87) PCT Pub. No.: WO2019/064402
PCT Pub. Date: Apr. 4, 2019

(65) Prior Publication Data
US 2020/0343226 A1    Oct. 29, 2020

(51) Int. Cl.
*H01L 25/07* (2006.01)
*H01L 29/872* (2006.01)
(Continued)

(52) U.S. Cl.
CPC ...... *H01L 25/072* (2013.01); *H01L 23/49844* (2013.01); *H01L 29/7393* (2013.01);
(Continued)

(58) Field of Classification Search
CPC ..... H01L 29/16; H01L 29/16; H01L 29/1608; H01L 29/73; H01L 29/739;
(Continued)

(56) References Cited

U.S. PATENT DOCUMENTS 8,823,053 B2 * 9/2014 Sakiyama ............. H01L 23/552
257/140
2010/0213915 A1   8/2010 Kora et al.
(Continued)

FOREIGN PATENT DOCUMENTS

JP    2006319059 A    11/2006
JP    2006319095 A    11/2006
JP    2010200406 A     9/2010

OTHER PUBLICATIONS

International Search Report issued in PCT/JP2017/035096; dated Dec. 5, 2017.

*Primary Examiner* — Monica D Harrison
(74) *Attorney, Agent, or Firm* — Studebaker & Brackett PC

(57) ABSTRACT

An object of the present invention is to suppress reduction in a temperature cycle life of a wiring in a two-in-one type chopper module. A two-in-one type chopper module according to the present invention includes: a switching transistor; a first diode inverse-parallelly connected to the switching transistor; a second diode serially connected to the switching transistor and the first diode; a first wiring pattern mounting the switching transistor and the first diode; and a second wiring pattern mounting the second diode, wherein each of the switching transistor and the first diode has a power loss substantially identical with each other at a time of a forward direction current conduction, and an effective area of the second diode is larger than an effective area of the first diode.

5 Claims, 5 Drawing Sheets

(51) Int. Cl.
 *H01L 23/498* (2006.01)
 *H01L 29/739* (2006.01)
 *H02M 7/537* (2006.01)
 *H01L 29/16* (2006.01)
(52) U.S. Cl.
 CPC .......... *H01L 29/872* (2013.01); *H02M 7/537* (2013.01); *H01L 29/1608* (2013.01)
(58) Field of Classification Search
 CPC ... H01L 29/7393; H01L 29/87; H01L 29/872; H01L 25/07; H01L 25/072; H01L 23/49; H01L 23/498; H01L 23/4984; H01L 23/49844
 USPC ......................................................... 257/476
 See application file for complete search history.

(56) References Cited

U.S. PATENT DOCUMENTS

2013/0286618 A1* 10/2013 Shibasaki ......... H01L 31/02021
 361/772
2018/0131289 A1* 5/2018 Ohnishi .............. H02M 7/2176

* cited by examiner

2-IN-1 TYPE CHOPPER MODULE

TECHNICAL FIELD

The present invention relates to a two-in-one type chopper module.

BACKGROUND ART

There is a semiconductor module as a semiconductor device used for power control. Examples of the semiconductor module include an insulated gate bipolar transistor (IGBT). The IGBT module performs an on-off control of a conduction current by a gate drive signal, and is capable of a high-voltage and large-current switching. A semiconductor power module including the IGBT is widely used in an inverter driving a motor, for example.

A two-in-one type semiconductor module can be easily mounted on a motor drive device, for example, thus is in common use. The two-in-one type semiconductor module includes an IGBT module and a chopper module, for example.

The two-in-one type IGBT module is made up of two circuits serially connected to each other, and each circuit includes an IGBT element and a diode element inverse-parallelly connected to the IGBT element. The IGBT element and the diode element are often mounted on one insulating substrate in the IGBT module. In a normal inverter operation, a similar degree of current flows in the IGBT element and the diode element alternately, thus either element always has heat, and the insulating substrate receives the heat from these elements.

A two-in-one type chopper module has a configuration that the IGBT element is excluded from one circuit in the two circuits which are serially connected in the two-in-one type IGBT module. Accordingly, the chopper module includes an insulating substrate on which only the diode element is mounted. It is necessary to flow the similar degree of current in the IGBT element and the diode element alternately in the inverter operation in the circuit including the IGBT element and the diode element inverse-parallelly connected to the IGBT element, thus the circuit has the same configuration as that of the IGBT module described above. The insulating substrate on which only the diode element is mounted receives less heat compared to the insulating substrate on which both the diode element and the IGBT element are mounted.

Patent Document 1 discloses in FIG. 8 a step-up chopper circuit and a step-down chopper circuit as a conventional technique having a circuit configuration similar to that of the chopper module.

PRIOR ART DOCUMENTS

Patent Documents

Patent Document 1: Japanese Patent Application Laid-Open No. 2010-200406

SUMMARY

Problem to be Solved by the Invention

Normally, the semiconductor module is placed in a cooler and positively cooled. Thus, the diode element solely mounted on the insulating substrate in the chopper module tends to have a low temperature side temperature lower than the IGBT element or the diode element both mounted on the insulating substrate. Accordingly, the diode element solely mounted on the insulating substrate in the chopper module has a large difference between a high temperature side temperature and a low temperature side temperature. As a result, there is a problem in the chopper module that a temperature cycle life of a wiring on the diode element reduces.

The present invention therefore has been made to solve the above problems, and it is an object of the present invention to suppress reduction in the temperature cycle life of the wiring in the two-in-one type chopper module.

Means to Solve the Problem

A two-in-one type semiconductor module according to the present invention includes: a switching transistor; a first diode inverse-parallelly connected to the switching transistor; a second diode serially connected to the switching transistor and the first diode; a first wiring pattern mounting the switching transistor and the first diode; and a second wiring pattern mounting the second diode, wherein each of the switching transistor and the first diode has a power loss substantially identical with each other at a time of a forward direction current conduction, and an effective area of the second diode is larger than an effective area of the first diode.

Effects of the Invention

In the two-in-one type semiconductor module according to the present invention, a similar degree of current flows in the switching transistor and the first diode alternately in the inverter operation, and a power loss therein is substantially the same. Accordingly, the insulating substrate mounting the first wiring pattern always receives heat, however, the insulating substrate mounting the second wiring pattern receives heat only when current is conducted to the second diode. Accordingly, when a cooling capacity for the both insulating substrates is equivalent, a low temperature side temperature of the second diode is lower than that of the first diode. However, the effective area of the second diode is larger than that of the first diode, thus the second diode has an amount of heat generation smaller than the first diode, and has a decreased high temperature side temperature. Accordingly, a temperature difference in the second diode decreases. As a result, a temperature cycle life of the wiring connected to the second diode increases.

These and other objects, features, aspects and advantages of the present invention will become more apparent from the following detailed description of the present invention when taken in conjunction with the accompanying drawings.

DESCRIPTION OF EMBODIMENT(S)

A. Premise Technique

Figure 1:
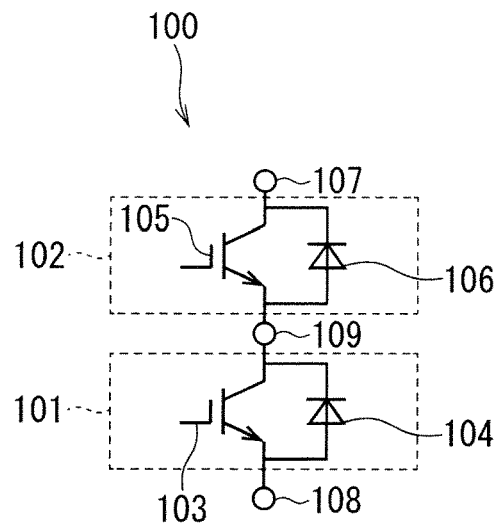
FIG. 1 A circuit diagram of a two-in-one type IGBT module.

FIG. 1 is a circuit diagram of a two-in-one type IGBT module 100 which is a premise technique of the present invention. The two-in-one type IGBT module 100 is made up of a circuit 101 and a circuit 102 serially connected to each other. The circuit 101 includes an IGBT 103 and a diode 104 inverse-parallelly connected to the IGBT 103. The circuit 102 includes an IGBT 105 and a diode 106 inverse-parallelly connected to the IGBT 105. The IGBTs 103 and 105 are made of Si, for example.

Three electrodes of P-main electrode 107, an N-main electrode 108, and an AC main electrode 109 constitute a main electrode of the two-in-one type IGBT module 100. The P-main electrode 107 is connected to a collector of the IGBT 105 and a cathode of the diode 106. The AC main electrode 109 is connected to a connection point between the circuit 101 and the circuit 102. The N main electrode 108 is connected to an emitter of the IGBT 103 and an anode of the diode 104.

Figure 2:
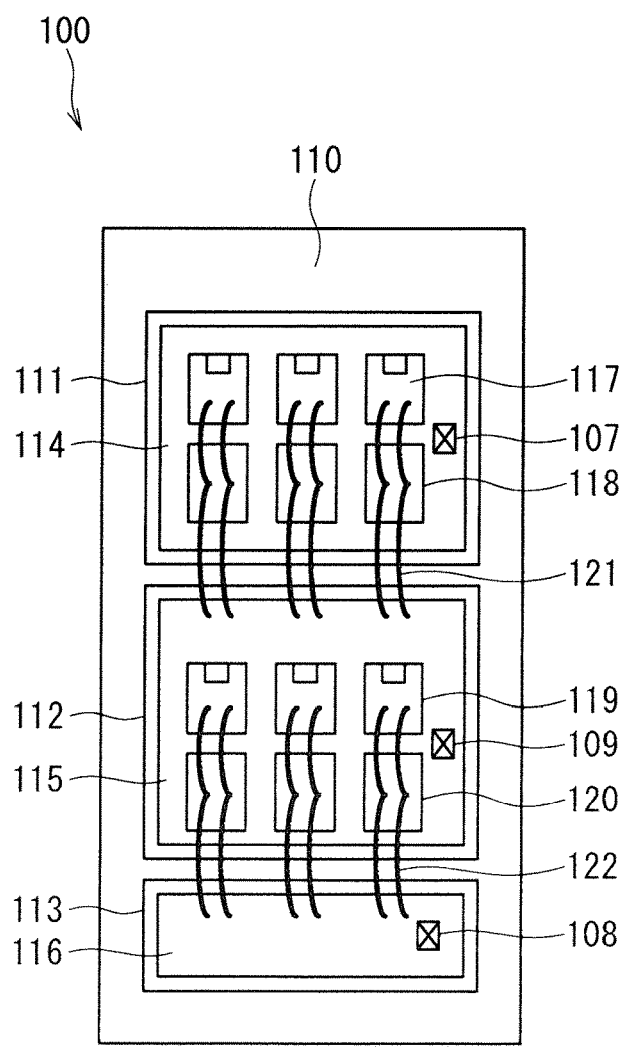
FIG. 2 An internal configuration diagram of the two-in-one type IGBT module.

FIG. 2 is a planar schematic view illustrating an internal structure of the two-in-one type IGBT module 100. A gate wiring, a sense wiring, and a chassis, for example, are not illustrated in FIG. 2 for easily describing the internal structure.

In FIG. 2, insulating substrates 111, 112, and 113 are disposed on a base plate 110. Wiring patterns 114, 115, and 116 are formed on the insulating substrates 111, 112, and 113, respectively. The circuit 102 illustrated in FIG. 1 is formed on the wiring pattern 114, and the circuit 101 illustrated in FIG. 1 is formed on the wiring pattern 115. Specifically, three IGBT elements 117 and three diode elements 118 are disposed on the wiring pattern 114 by solder joint. Three IGBT elements 119 and three diode elements 120 are disposed on the wiring pattern 115 by solder joint.

The three IGBT elements 117 constitute the IGBT 105 in FIG. 1, and the three diode elements 118 constitute the diode 106 in FIG. 1. The three IGBT elements 119 constitute the IGBT 103 in FIG. 1, and the three diode elements 120 constitute the diode 104 in FIG. 1.

An aluminum wiring 121 establishes a connection between a surface electrode of the IGBT element 117 and a surface electrode of the diode element 118 and between the surface electrode of the diode element 118 and the wiring pattern 115. An aluminum wiring 122 establishes a connection between a surface electrode of the IGBT element 119 and a surface electrode of the diode element 120 and between the surface electrode of the diode element 120 and the wiring pattern 116. The aluminum wirings 121 and 122 are described herein, however, a wiring made of the other material such as copper is also applicable.

The P-main electrode 107, the AC main electrode 109, and the N-main electrode 108 are connected to the wiring patterns 114, 115, and 116, respectively.

In an inverter operation, substantially the same current flows in two types of elements formed on the same insulating substrate, that is to say, the IGBT element 117 and the diode element 118 or the IGBT element 119 and the diode element 120 in an inverse direction alternately, and each element generates heat. These two types of elements are designed to have substantially the same power loss in conducting the current in a forward direction, thus have substantially the same maximum chip temperature.

Figure 3:
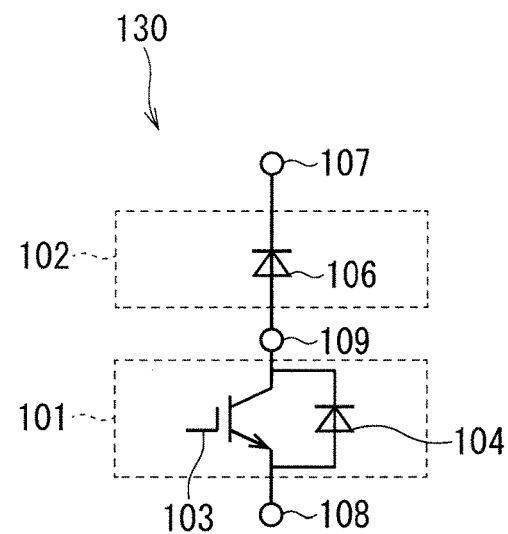
FIG. 3 A circuit diagram of a two-in-one type chopper module.

FIG. 3 is a circuit diagram of a two-in-one type chopper module 130 which is a premise technique of the present invention. The two-in-one type chopper module 130 includes the circuit 101 and the diode 106 serially connected to the circuit 101. In other words, the two-in-one type chopper module 130 has a configuration that the IGBT 105 is excluded from the circuit 102 in the two-in-one type IGBT module 100.

Figure 4:
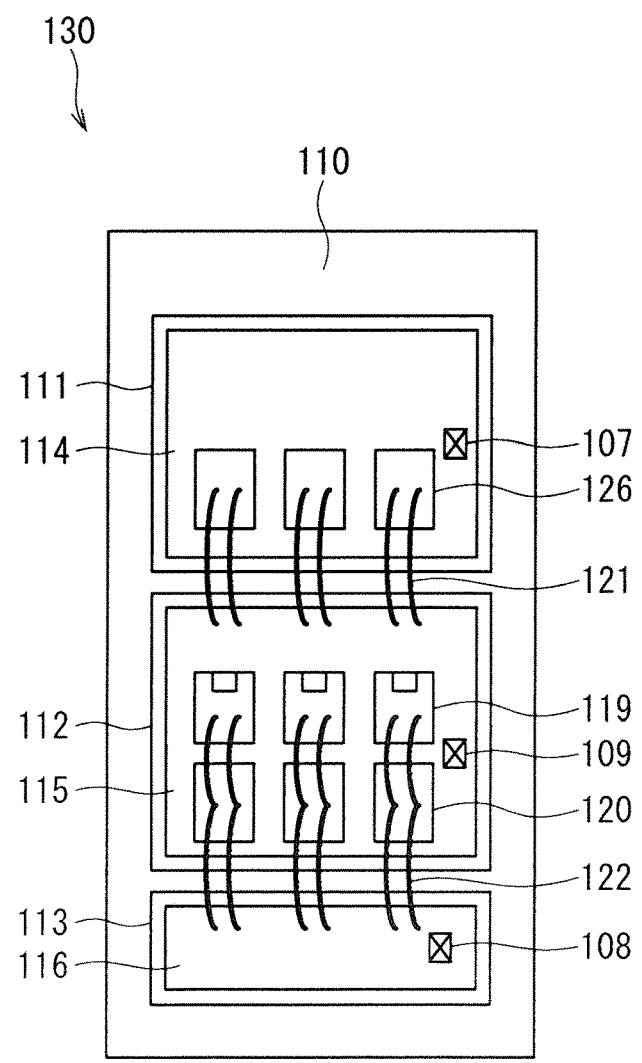
FIG. 4 An internal configuration diagram of the two-in-one type chopper module.

FIG. 4 is a planar schematic view illustrating an internal structure of the two-in-one type chopper module 130. A gate wiring, a sense wiring, and a chassis, for example, are not illustrated in FIG. 4 for easily describing the internal structure.

The internal configuration of the two-in-one type chopper module 130 illustrated in FIG. 4 is different from the internal configuration of the two-in-one type IGBT module 100 illustrated in FIG. 2 in that the three IGBT elements 117 are not formed on the wiring pattern 114 on the insulating substrate 111 but only the three diode elements 118 are formed thereon. Also in the two-in-one type chopper module 130, it is necessary to flow substantially the same current in the IGBT 103 and the diode 104 alternately in the inverse direction in the inverter operation, thus the configuration on the insulating substrates 112 and 113 is similar to that of the two-in-one type IGBT module 100.

The two-in-one type chopper module 130 is obtained by excluding the IGBT 105 from the two-in-one type IGBT module 100, thus has an advantage that a new constituent member or process is not necessary for the two-in-one type IGBT module 100. Accordingly, the two-in-one type chopper module 130 is widely used in a three-level circuit, for example.

In the inverter operation in the two-in-one type chopper module 130, the current flows in the IGBT 103 and the diode 104 alternately. Accordingly, the insulating substrate 112 always receives the heat supply from either the IGBT element 119 or the diode element 120. In the meanwhile, only a diode element 126 is mounted on the insulating substrate 111, and the IGBT element is not mounted. A magnitude of the current flowing in the diode element 126 is substantially the same as that flowing in the IGBT element 119 or the diode element 120, however, the heat is generated only when the current is conducted to the diode element 126 in the insulating substrate 111. Accordingly, the insulating substrate 111 receives a small amount of heat compared to the insulating substrate 112.

The semiconductor module is normally placed in a cooler and positively cooled, thus when a cooling capacity for the insulating substrates 111 and 112 is equivalent, a low temperature side temperature in the inverter operation of the diode element 126 mounted on the insulating substrate 111 tends to be lower than that of the IGBT element 119 or the diode element 120 mounted on the insulating substrate 112. When the diode elements 120 and 126 have an equal high temperature side temperature when the current is conducted, a temperature difference in the low temperature and the high temperature in the diode element 126 is larger than that in the diode element 120. A temperature cycle life of the aluminum wiring is reduced as the temperature difference increases, thus there is a problem that the temperature cycle life of the aluminum wiring 121 on the diode element 126 is reduced due to the increase in the temperature difference in the diode element 126.

B. Embodiment 1

B-1. Configuration

Figure 5:
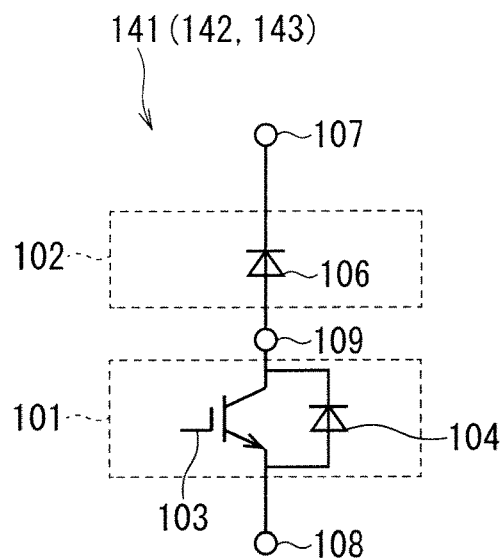
FIG. 5 A circuit diagram of a two-in-one type chopper module according to an embodiment 1.

FIG. 5 is a circuit diagram of a two-in-one type chopper module 141 according to an embodiment 1. The circuit diagram of the two-in-one type chopper module 141 illustrated in FIG. 5 is similar to that of the two-in-one type chopper module 130 illustrated in FIG. 3.

Figure 6:
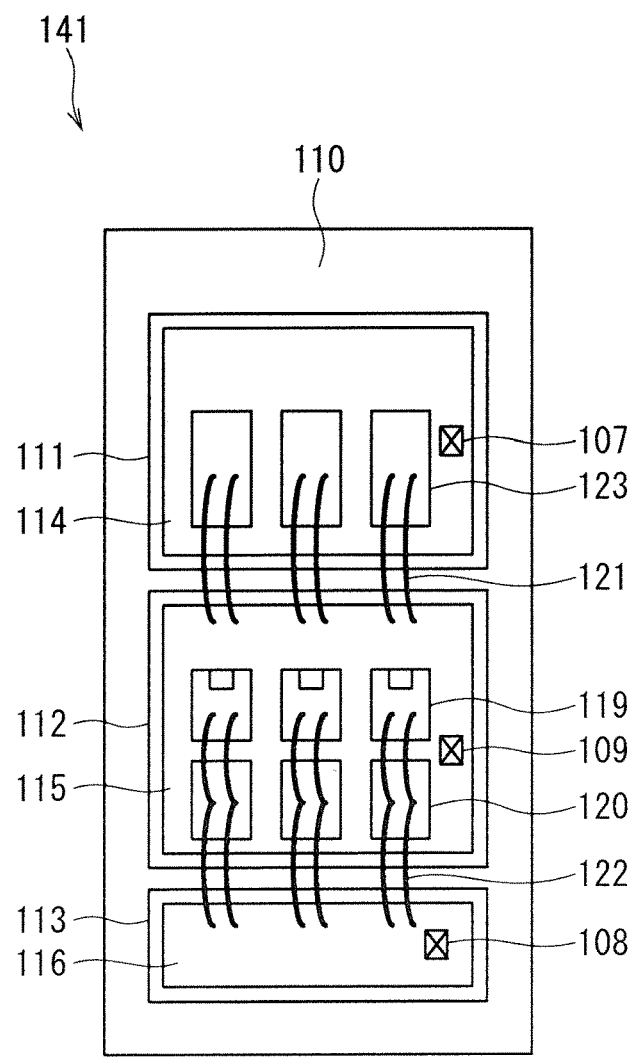
FIG. 6 An internal configuration diagram of the two-in-one type chopper module according to the embodiment 1.

FIG. 6 is an internal configuration diagram of the two-in-one type chopper module 141. A gate wiring, a sense wiring, and a chassis, for example, are not illustrated in FIG. 6 for easily describing the internal structure. In the two-in-one type chopper module 141, three diode elements 123 are disposed on the wiring pattern 114 by solder joint instead of the three diode elements 118, and the other configuration is similar to the internal configuration of the two-in-one type chopper module 130 illustrated in FIG. 4. The three diode elements 123 constitute the diode 106 in FIG. 5.

The diode element 123 has a large effective area per element compared to the diode element 120. The number of diode elements 123 is the same as that of the diode element 120. Accordingly, a total effective area of all of the diode elements 123 mounted on the insulating substrate 111 is larger than that of all of the diode elements 120 mounted on the insulating substrate 112.

The number of diode elements 123 and diode elements 120 is not limited to three illustrated in FIG. 6, however, one or more diode elements are also applicable as long as the number of them are the same as each other.

The IGBT element 119 and the diode element 120 mounted on the insulating substrate 112 are designed to have substantially the same power loss, thus have substantially the same maximum chip temperature when substantially the same current flows in those elements alternately in the inverse direction. When there is a difference between the maximum chip temperatures in those elements, a difference occurs in the temperature cycle life of the aluminum wirings in those elements, thus the difference between the maximum chip temperatures are preferably 20% or less.

Normally, the semiconductor module is placed in a cooler and positively cooled. In the inverter operation of the two-in-one type chopper module 141, the current flows in both the IGBT element 119 and the diode element 120 and the heat is generated on the insulating substrate 112, however, the heat is generated only when the current is conducted to the diode element 123 on the insulating substrate 111. Thus, the insulating substrate 111 has a longer time of being cooled while the heat is not generated than the insulating substrate 112. Thus, the diode element 123 has the low temperature side temperature lower than that of the IGBT element 119 and the diode element 120.

However, in the present embodiment, the diode element 123 has the larger effective area than the diode element 120, thus has a decreased amount of heat generation when the same current is conducted. As a result, the diode element 123 has a lower maximum temperature than the diode element 120. Accordingly, a temperature difference in the high temperature and the low temperature in the diode element 123 decreases, and reduction in the temperature cycle life of the aluminum wiring 121 on the diode element 123 can be prevented.

A chopper circuit illustrated in FIG. 1 in Patent Document 1 is similar to the two-in-one type chopper module 141 illustrated in FIG. 5 in the present specification as a circuit diagram. However, the chopper circuit illustrated in FIG. 1 in Patent Document 1 has a configuration that a small diode is inverse-parallelly connected to a switching element to prevent a momentary application of inverse voltage to the switching element. The current similar to that in the switching element cannot be conducted to the inverse-parallel diode, thus the chopper circuit illustrated in FIG. 1 in Patent Document 1 is different from the two-in-one type chopper module 141 in use.

B-2. Modification Example

In the description described above, the IGBT made of Si is applied to the switching transistor constituting the two-in-one type chopper module, however, a wide-band-gap element made of SiC, for example, may be applied to the switching transistor. Accordingly, the switching loss of the switching transistor can be reduced.

A wide-band-gap element made of SiC, for example, may be applied to the diode 104. Accordingly, a recovery loss of the diode 104 can be reduced.

A wide-band-gap element made of SiC, for example, may be applied to the diode 106. Accordingly, a conduction loss in the diode 106 can be reduced.

A material of the switching transistor or the diode may be appropriately selected to obtain optimal characteristics in accordance with a purpose of use of the two-in-one type chopper module.

In FIG. 5, the cathode of the diode 106 is connected to the P-main electrode 107, and an anode is connected to the AC main electrode 109, however, a direction thereof may be reversed in accordance with a circuit configuration to be used.

In FIG. 5, the circuit 101 made up of the IGBT 103 and the diode 104 is connected between the AC main electrode 109 and the N-main electrode 108, however, this configuration is merely an example. The circuit 101 may be connected between the P-main electrode 107 and the AC main electrode 109.

Furthermore, in the above description, the three insulating substrates are included, however, the number of insulating substrates is not limited to three as long as each wiring pattern is electrically independent of each other.

The modification example described herein may also be applied to an embodiment 2 and an embodiment 3 described hereinafter.

B-3. Effect

The two-in-one type chopper module 141 according to the embodiment 1 includes the IGBT 103 which is the switching transistor, the diode 104 which is a first diode inverse-parallelly connected to the IGBT 103, the diode 106 which is a second diode serially connected to the IGBT 103 and the diode 104, the wiring pattern 115 which is a first wiring pattern mounting the IGBT 103 and the diode 104, and the wiring pattern 114 which is a second wiring pattern mounting the diode 106. The power loss at a time of forward direction current conduction to the IGBT 103 and the diode 104 is substantially the same, thus the low temperature side temperature of the diode 106 in the inverter operation is lower than those of the IGBT 103 and the diode 104. However, the effective area of the diode 106 is larger than that of the diode 104, thus the amount of heat generation in the diode 106 at the time of conducting the same current can be smaller than that in the diode 104. As a result, the diode element 106 has a lower maximum temperature than the diode 104. Accordingly, a temperature difference in the high temperature and the low temperature in the diode 106 decreases, and reduction in the temperature cycle life of the aluminum wiring 121 on the diode 106 can be prevented.

In the two-in-one type chopper module 141, the diode 104 which is the first diode is made up of the diode element 120 which is one or a plurality of first diode elements, and the diode 106 which is the second diode is made up of the diode element 123 which is a second diode element, the number of which is the same as that of the diode element 120. The effective area of the diode element 123 per element is larger than that of the diode element 120 per element. Accordingly, a total effective area of the diode elements 123 mounted on the insulating substrate 111 is larger than that of the diode elements 120 mounted on the insulating substrate 112. As a result, the diode element 123 has a lower maximum temperature than the diode element 120. Accordingly, a temperature difference in the high temperature and the low temperature in the diode element 123 decreases, and reduction in the temperature cycle life of the aluminum wiring 121 on the diode element 123 can be prevented.

C. Embodiment 2

C-1. Configuration

Figure 7:
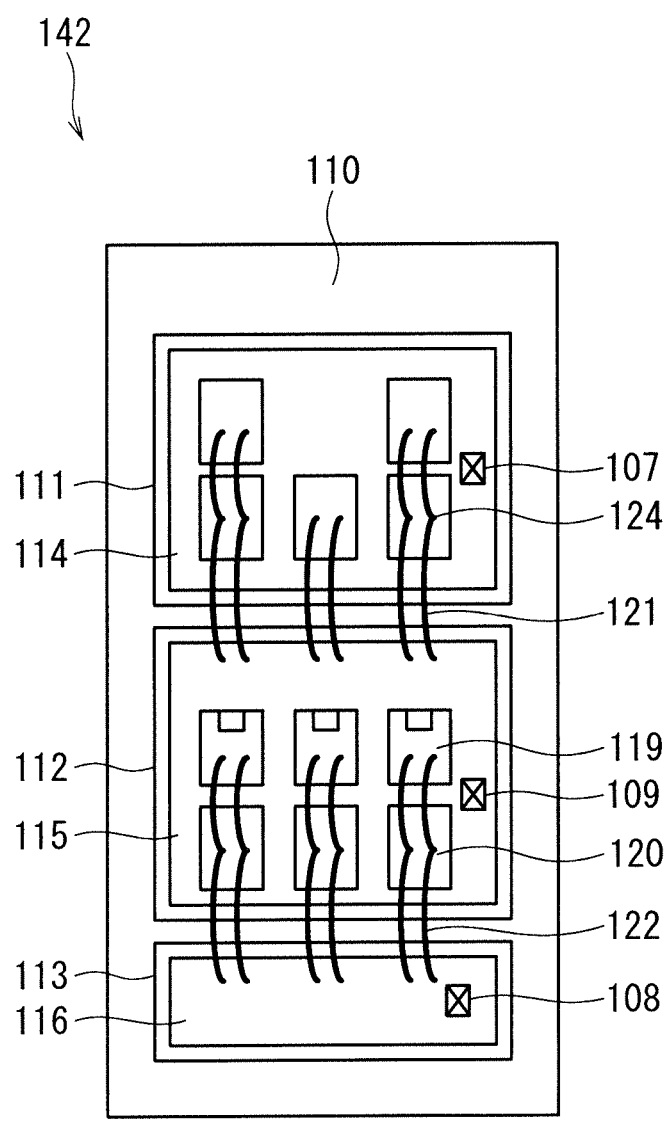
FIG. 7 An internal configuration diagram of a two-in-one type chopper module according to an embodiment 2.

FIG. 7 is an internal configuration diagram of a two-in-one type chopper module 142 according to an embodiment 2. A circuit diagram of the two-in-one type chopper module 142 is illustrated in FIG. 5, and is the same as that of the two-in-one type chopper module 141 according to the embodiment 1.

A gate wiring, a sense wiring, and a chassis, for example, are not illustrated in FIG. 7 for easily describing the internal structure.

In the configuration of the two-in-one type chopper module 142, the configuration on the wiring pattern 114 on the insulating substrate 111 is different from the two-in-one type chopper module 141 according to the embodiment 1, and the other configuration is similar to that of the two-in-one type chopper module 141. Thus, only the configuration on the wiring pattern 114 is described hereinafter.

In the two-in-one type chopper module 142, five diode elements 124 are disposed on the wiring pattern 114 on the insulating substrate 111. That is to say, in the two-in-one type chopper module 142, the five the diode elements 125 constitute the diode 106 in FIG. 5.

The three diode elements 120 are disposed on the wiring pattern 115 on the insulating substrate 112, and the number of diode elements 124 is larger than that of the diode elements 120. The diode element 124 and the diode element 120 are the same diode elements, and have the same effective area per element. Thus, a total effective area of all of the diode elements 124 on the wiring pattern 114 is larger than that of all of the diode elements 120 on the wiring pattern 115. Accordingly, the effective area of the diode 106 is larger than that of the diode 104.

In FIG. 7, the number of diode elements 124 is five, but is not limited to five as long as it is larger than the number of diode elements 120.

In the manner similar to the embodiment 1, the heat is generated only when the current is conducted to the diode element 124 on the insulating substrate 111, thus a period of heat generation thereon is shorter than that on the insulating substrate 112 in which the IGBT element 119 and the diode element 120 alternately generate heat. Thus, the diode element 124 has the low temperature side temperature lower than that of the IGBT element 119 and the diode element 120.

However, in the present embodiment, the total effective area of the five diode elements 124 is larger than that of the three diode elements 120, thus the amount of heat generation in the five diode elements 124 can be made smaller than that in the three diode elements 120 at the time of conducting the same current. As a result, the diode element 124 has a lower maximum temperature than the diode element 120. Accordingly, a temperature difference in the high temperature and the low temperature in the diode element 124 decreases, and reduction in the temperature cycle life of the aluminum wiring 121 on the diode element 124 can be prevented.

C-2. Effect

In the two-in-one type chopper module 142 according to the embodiment 2, the diode 104 which is the first diode is made up of the diode element 120 which is one or the plurality of first diode elements, the diode 106 which is the second diode is made up of the diode element 124 which is the second diode element larger than the diode element 120 in number, and the effective area of the diode element 124 per element is equal to the effective area of the diode element 120 per element. Accordingly, a total effective area of all of the diode elements 124 mounted on the insulating substrate 111 is larger than that of all of the diode elements 120 mounted on the insulating substrate 112. Thus, the amount of heat generation in all of the diode elements 124 mounted on the insulating substrate 111 is smaller than that in all of the diode elements 120 mounted on the insulating substrate 112. Thus, the diode element 124 has a lower maximum temperature than the diode element 120. Accordingly, a temperature difference in the high temperature and the low temperature in the diode element 124 decreases, and reduction in the temperature cycle life of the aluminum wiring 121 on the diode element 124 can be prevented.

D. Embodiment 3

D-1. Configuration

Figure 8:
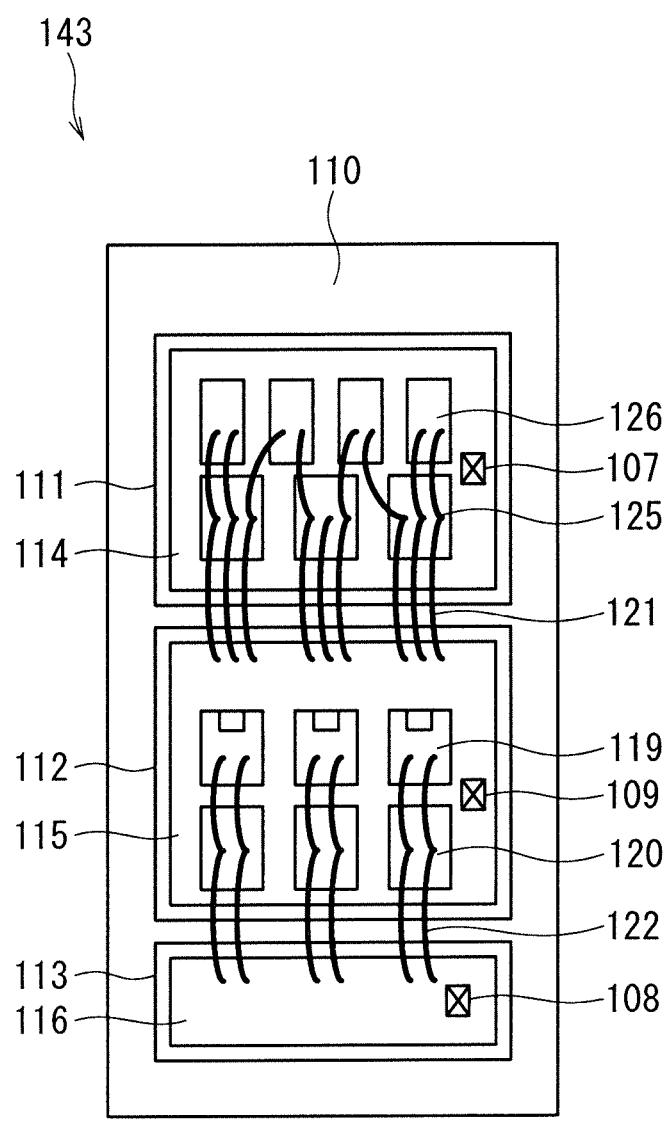
FIG. 8 An internal configuration diagram of a two-in-one type chopper module according to an embodiment 3.

FIG. 8 is an internal configuration diagram of a two-in-one type chopper module 143 according to an embodiment 3. A circuit diagram of the two-in-one type chopper module 143 is illustrated in FIG. 5, and is similar to that of the two-in-one type chopper module 141 according to the embodiment 1.

A gate wiring, a sense wiring, and a chassis, for example, are not illustrated in FIG. 8 for easily describing the internal structure.

In the configuration of the two-in-one type chopper module 143, the configuration on the wiring pattern 114 on the insulating substrate 111 is different from the two-in-one type chopper module 141 according to the embodiment 1, and the other configuration is similar to the two-in-one type chopper module 141. Thus, only the configuration on the wiring pattern 114 is described hereinafter.

The three diode elements 125 made of Si and the four Schottky barrier diode elements 126 made of SiC (silicon carbide) are disposed on the wiring pattern 114. That is to say, in the two-in-one type chopper module 143, the parallel connection of the three diode elements 125 and the four Schottky barrier diode elements 126 constitutes the diode 106 in FIG. 5. In the above description, the Schottky barrier diode element 126 is made of SiC, however, the other wide-band-gap semiconductor may be adopted as a material.

The diode 106 has the effective area larger than the diode 104. Accordingly, a total effective area of the diode elements 125 and the Schottky barrier diode elements 126 is made up to be larger than that of the diode elements 120 disposed on the wiring pattern 115. The conduction loss of the diode 106 is smaller than that of the diode 104. As long as this condition is satisfied, the number of diode elements 125 and Schottky barrier diode elements 126 is not limited to that illustrated in FIG. 8, however, one or a plurality ones are also applicable. In the above description, the effective area of the diode element 125 per element is equal to the effective area of the diode element 120 per element in FIG. 8, but may also be larger or smaller than the effective area of the diode element 120 per element. In the above description, the effective area of the Schottky barrier diode element 126 per element is smaller than the effective area of the diode element 120 per element in FIG. 8, but may also be equal to or larger than that of the diode element 120.

D-2. Effect

In the two-in-one type chopper module 143 according to the embodiment 3, the diode 104 which is the first diode is made up of the diode element 120 which is one or the plurality of first diode elements, and the parallel connection of the diode element 125 made of Si and the Schottky barrier diode element 126 made of a wide-band-gap semiconductor constitutes the diode 106 which is the second diode. In the diode element 125 and the Schottky barrier diode element 126, the number and the effective area per element are not particularly limited. However, the total effective area of the diode element 125 and the Schottky barrier diode element 126, that is to say, the effective area of the diode 106 is set to larger than the total effective area of the diode element 120, that is to say, the effective area of the diode 104. Thus, in the manner similar to the embodiment 1, the diode element 125 and the Schottky barrier diode element 126 have a lower maximum temperature than the diode element 120. Accordingly, a temperature difference in the high temperature and the low temperature in the diode element 125 and the Schottky barrier diode element 126 decreases, and reduction in the temperature cycle life of the aluminum wiring 121 on these diode elements can be prevented.

The Schottky barrier diode element 126 made of the wide-band-gap semiconductor has a small conduction loss in a small current region. The diode element 125 made of Si has a small conduction loss in a large current region and a large serge current withstand. Accordingly, the two-in-one type chopper module 143 is configured to be a module having the small loss and the high serge current withstand.

In the above configuration, the IGBT is used for the switching transistor constituting the two-in-one type chopper module. However, a reverse conduction type transistor such as a reverse conduction IGBT made of silicon or MOSFET may also be used for the switching transistor. In this case, when the switching transistor is turned on at the time of the forward direction current conduction to the diode 104, the current also flows in the reverse conduction transistor, thus a voltage drop in the whole circuit 101 can be made small compared to the case where the current is conducted only to the diode 104.

In this case, the effective area of the diode 106 in the circuit 102 is made larger than the effective area of the diode 104 as described above. However, the total effective area of the diode 106 is made large to such a degree that the conduction loss of the diode 106 in the circuit 102 is smaller than the conduction loss of the whole circuit 101 in the case where the reverse conduction transistor is turned on at the time of the forward direction current conduction to the diode 104, thus the reduction in the temperature cycle life of the aluminum wiring on the diode 106 can be prevented.

According to the present invention, the above embodiments can be arbitrarily combined, or each embodiment can be appropriately varied or omitted within the scope of the invention. The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 100 two-in-one type IGBT module, 101, 102 circuit, 103, 105 IGBT, 104, 106 diode, 107 P-main electrode, 108 N-main electrode, 109 AC main electrode, 110 base plate, 111, 112, 113 insulating substrate, 114, 115, 116 wiring pattern, 117, 119 IGBT element, 118 120, 123, 124, 125 diode element, 121, 122 aluminum wiring, 126 Schottky barrier diode element, 130, 141, 142, 143 two-in-one chopper module

The invention claimed is:

1. A two-in-one type chopper module, comprising:
a switching transistor;
a first diode inverse-parallelly connected to the switching transistor;
a second diode serially connected to the switching transistor and the first diode;
a first wiring pattern mounting the switching transistor and the first diode; and
a second wiring pattern mounting the second diode, wherein
each of the switching transistor and the first diode has a power loss substantially identical with each other at a time of a forward direction current conduction,
an effective area of the second diode is larger than an effective area of the first diode, and
the second diode has a lower maximum temperature than the first diode.

2. The two-in-one type chopper module according to claim 1, wherein
the first diode is made up of one or a plurality of first diode elements,
the second diode is made up of a second diode element, a total number of which is identical with a total number of the first diode element, and
an effective area of the second diode element per element is larger than an effective area of the first diode element per element.

3. The two-in-one type chopper module according to claim 1, wherein
the first diode is made up of one or a plurality of first diode elements,
the second diode is made up of a second diode element, a total number of which is larger than a total number of the first diode element, and
an effective area of the second diode element per element is equal to an effective area of the first diode element per element.

4. The two-in-one type chopper module according to claim 1, wherein
the first diode is made up of one or a plurality of first diode elements, and
the second diode is made up of a parallel connection of a diode element made of Si and a Schottky barrier diode element made of a wide-band-gap semiconductor.

5. The two-in-one type chopper module according to claim 1, wherein
the switching transistor is made up of a reverse conduction type transistor, and
a voltage drop in the second diode is smaller than a voltage drop in the reverse conduction type transistor and the first diode in a case where current is conducted to both the reverse conduction type transistor and the first diode in a reverse conduction state.

\* \* \* \* \*